(12) United States Patent
Flaherty, IV et al.

(10) Patent No.: US 9,179,548 B2
(45) Date of Patent: Nov. 3, 2015

(54) CONTROLLED-IMPEDANCE OUT-OF-SUBSTRATE PACKAGE STRUCTURES EMPLOYING ELECTRICAL DEVICES, AND RELATED ASSEMBLIES, COMPONENTS, AND METHODS

(71) Applicant: Corning Cable Systems LLC, Hickory, NC (US)

(72) Inventors: Thomas Edmond Flaherty, IV, Phoenix, AZ (US); Gary Richard Trott, San Mateo, CA (US); Jeevan Kumar Vemagiri, Peoria, AZ (US)

(73) Assignee: Corning Cable Systems LLC, Hickory, NC (US)

( * ) Notice: Subject to any disclaimer, the term of this patent is extended or adjusted under 35 U.S.C. 154(b) by 351 days.

(21) Appl. No.: 13/790,287

(22) Filed: Mar. 8, 2013

(65) Prior Publication Data

US 2013/0322476 A1 Dec. 5, 2013

Related U.S. Application Data

(60) Provisional application No. 61/653,632, filed on May 31, 2012.

(51) Int. Cl.
*H05K 1/18* (2006.01)
*H01L 31/02* (2006.01)
(Continued)

(52) U.S. Cl.
CPC ................. *H05K 1/181* (2013.01); *H01L 23/66* (2013.01); *H01L 31/02002* (2013.01); *H01L 31/18* (2013.01); *H01L 33/62* (2013.01);
(Continued)

(58) Field of Classification Search
CPC ........... H05K 1/18; H05K 1/181; H01L 23/66
See application file for complete search history.

(56) References Cited

U.S. PATENT DOCUMENTS 6,906,353 B1 * 6/2005 Shieh et al. ...................... 257/98
6,985,056 B2 1/2006 Kanno ........................... 333/238
(Continued)

FOREIGN PATENT DOCUMENTS

WO WO 01/46991 A2 6/2001

OTHER PUBLICATIONS

Patent Cooperation Treaty International Search Report, Application No. PCT/US2013/043259, Mar. 21, 2014, 4 pages.
(Continued)

*Primary Examiner* — Jeremy C Norris

(57) ABSTRACT

Controlled-impedance out-of-substrate package structures employing electrical devices and related assemblies, components, and methods are disclosed. An out-of-substrate package structure may be used to electrically couple an electrical device to an electrical substrate, for example a printed circuit board. The out-of-substrate package structure may be electrically coupled to the electrical substrate. Ground paths of the out-of-substrate package structure may be arranged proximate to the electrical device and arranged symmetric with respect to at least one geometric plane intersecting the electrical device. In this regard, electric field lines generated by current flowing into the electrical device tend to terminate at the return or ground paths allowing for impedance to be more easily controlled. Accordingly, the out-of-substrate package structure may be impedance matched in a better way with respect to power provided from the electrical substrate enabling faster electrical device speeds.

27 Claims, 13 Drawing Sheets

(51) Int. Cl.
*H01L 33/62* (2010.01)
*H01L 31/18* (2006.01)
*H01L 23/66* (2006.01)
*H01S 5/183* (2006.01)
*H01S 5/022* (2006.01)

(52) U.S. Cl.
CPC ......... *H05K 1/18* (2013.01); *H01L 2924/0002* (2013.01); *H01S 5/02244* (2013.01); *H01S 5/183* (2013.01)

(56) References Cited

U.S. PATENT DOCUMENTS

| | | | |
|---|---|---|---|
| 7,097,468 B2 | 8/2006 | Ice | 439/79 |
| 7,215,009 B1 | 5/2007 | Leng et al. | 357/667 |
| 7,370,414 B2 | 5/2008 | Ice | 29/883 |
| 8,053,872 B1 | 11/2011 | Swan et al. | 257/659 |
| 2003/0043558 A1* | 3/2003 | Shirasaki | 361/767 |
| 2004/0163836 A1 | 8/2004 | Kumar et al. | 174/50 |
| 2006/0267176 A1* | 11/2006 | Offrein et al. | 257/691 |
| 2008/0267231 A1 | 10/2008 | Oktyabrsky et al. | 372/26 |
| 2012/0104570 A1 | 5/2012 | Kim | 257/659 |

OTHER PUBLICATIONS

PCT Written Opinion issued in related case PCT/US2013/43259, dated Mar. 21, 2014.

Rule 161 Communication issued in related case EP 13729550.7, dated Feb. 6, 2015.

\* cited by examiner

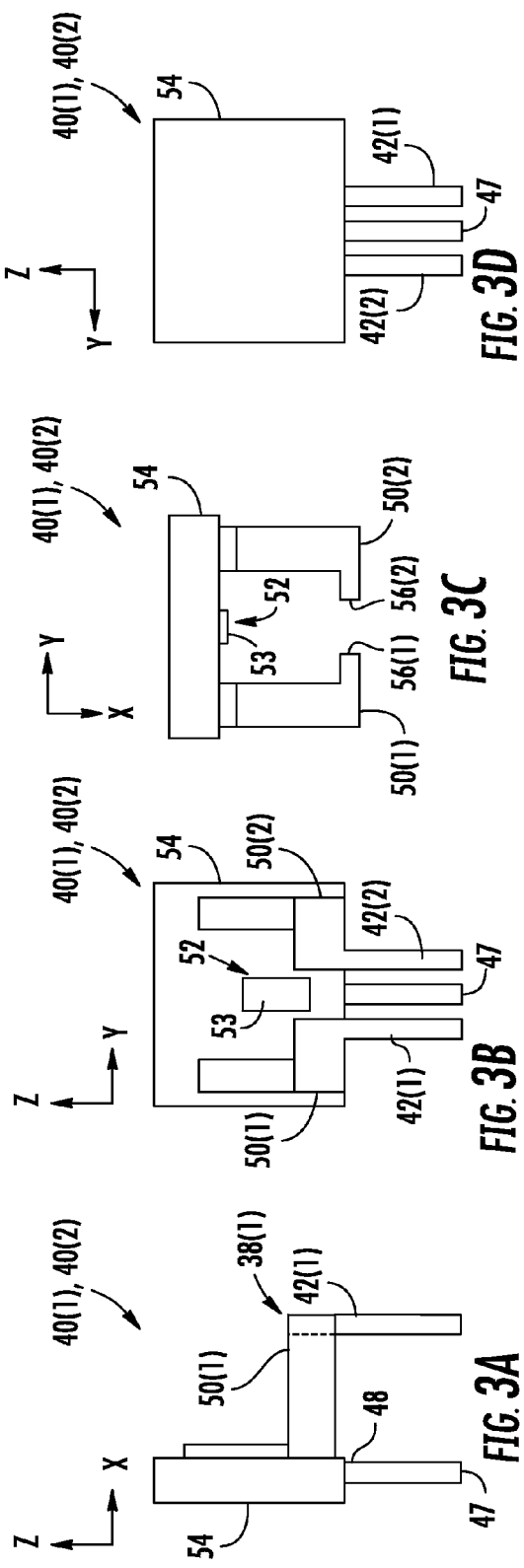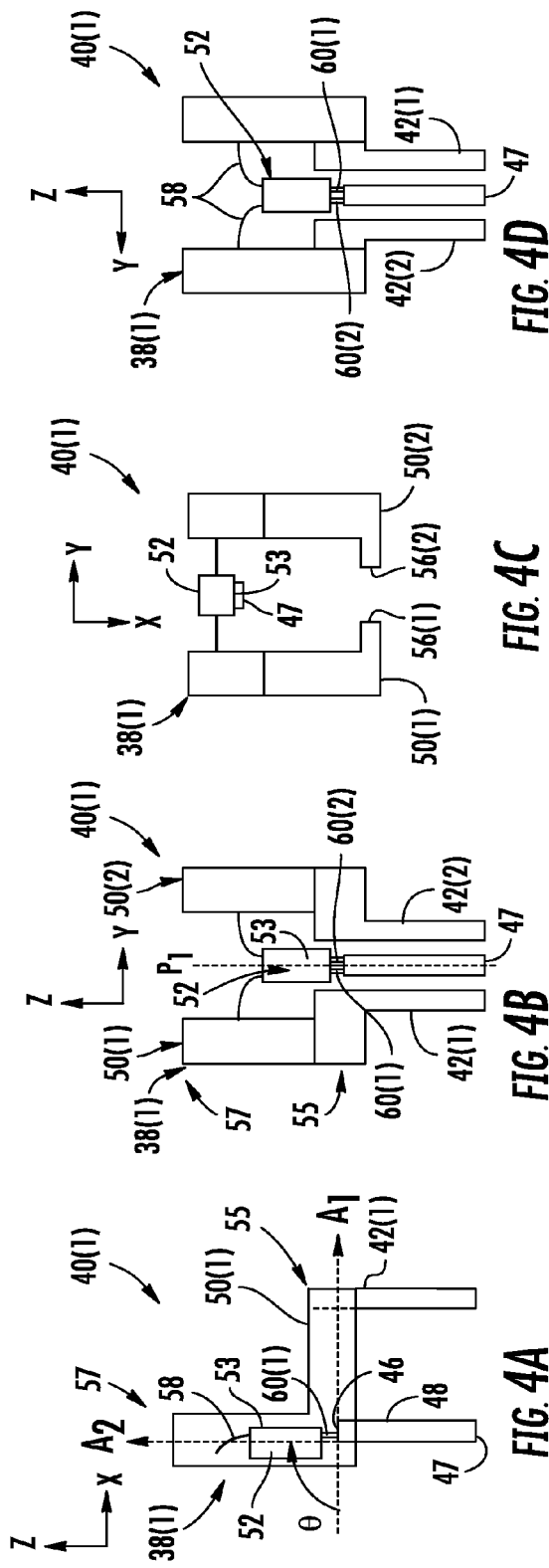

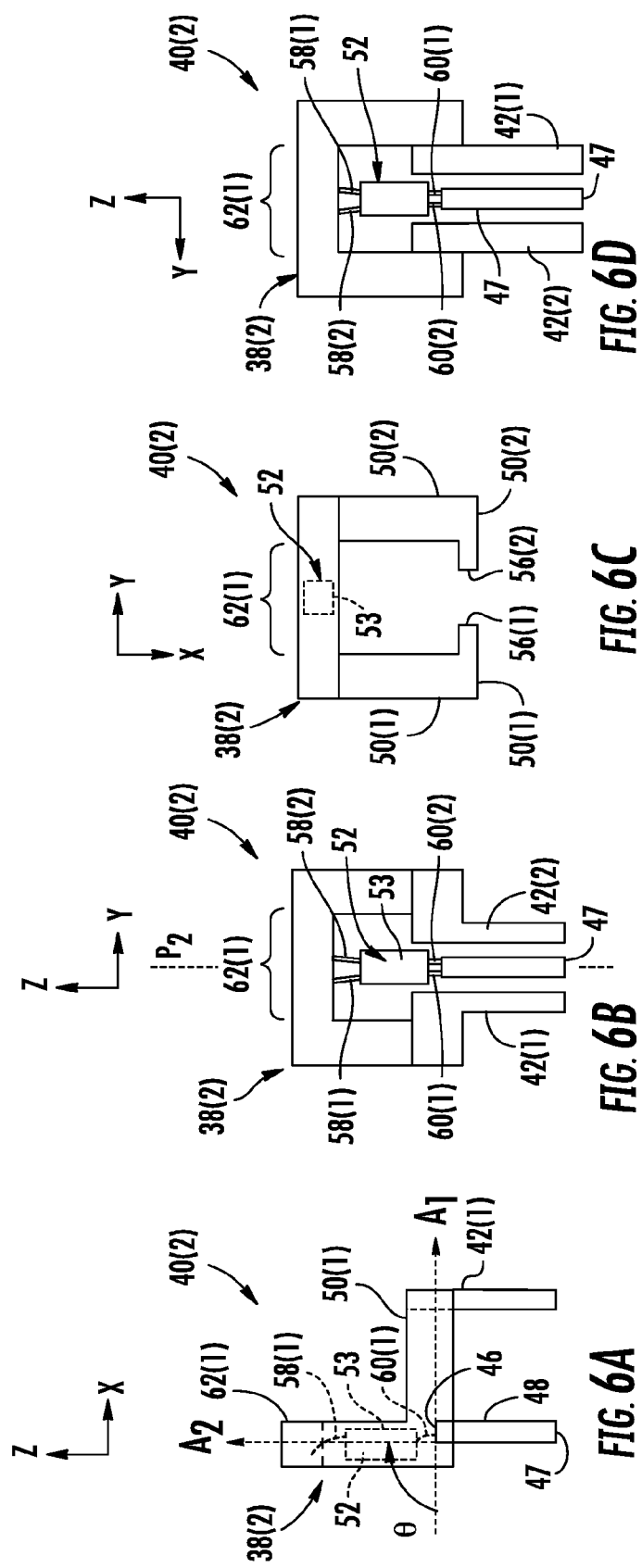

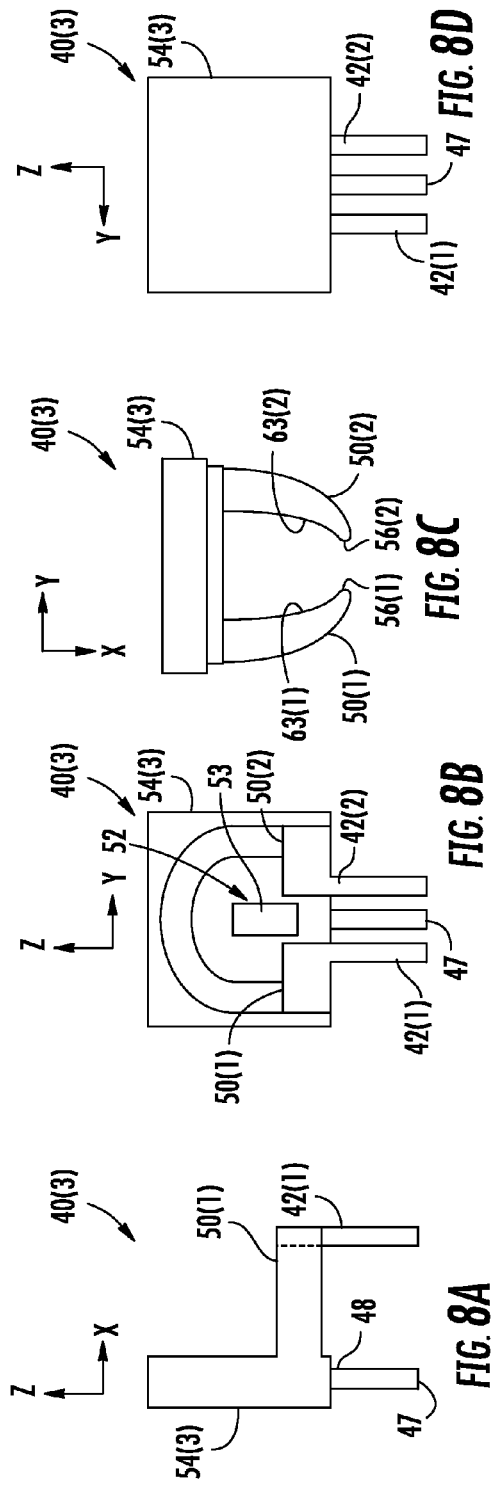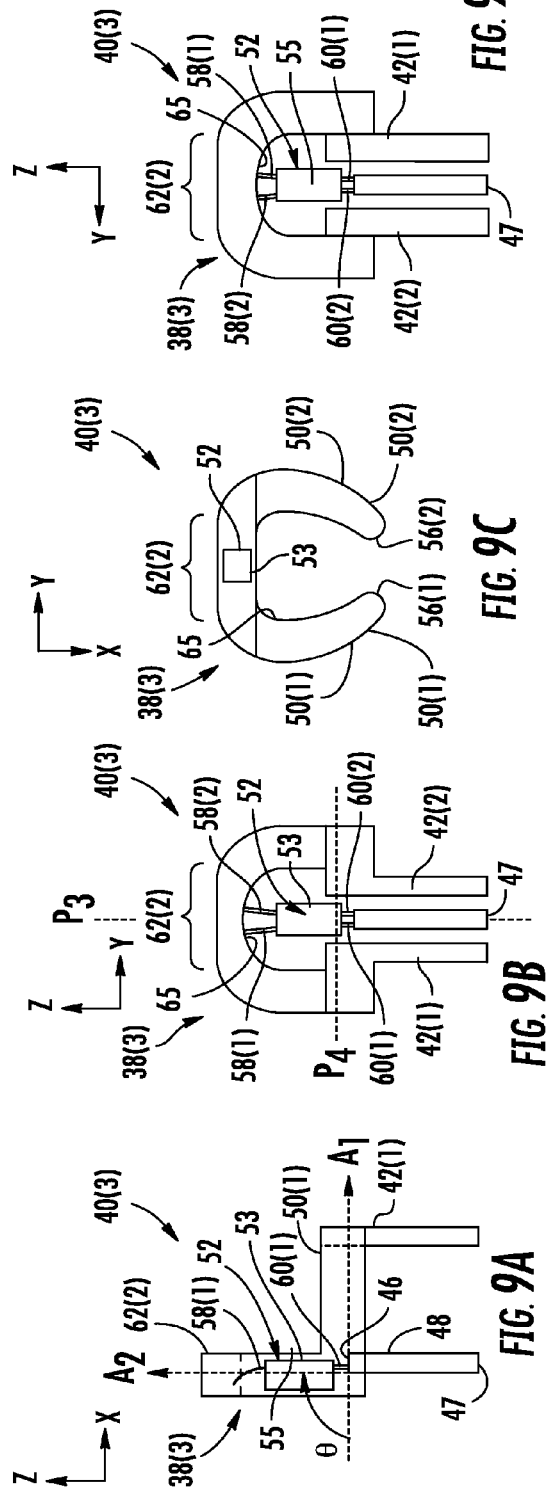

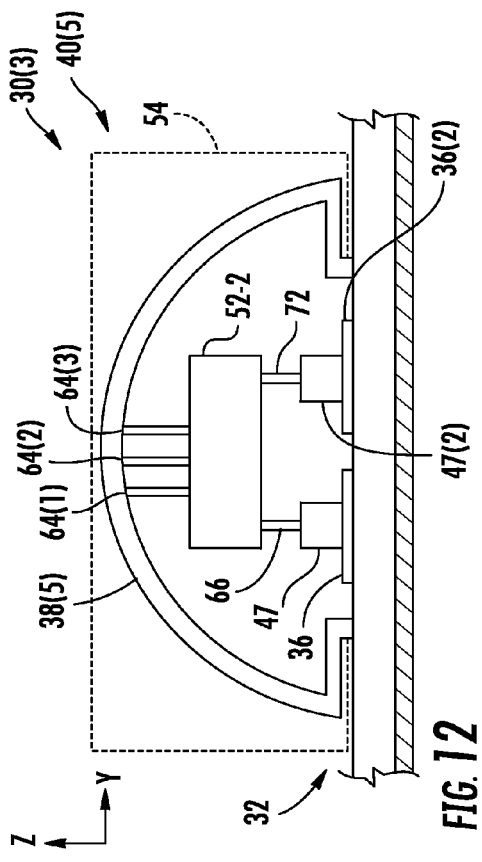
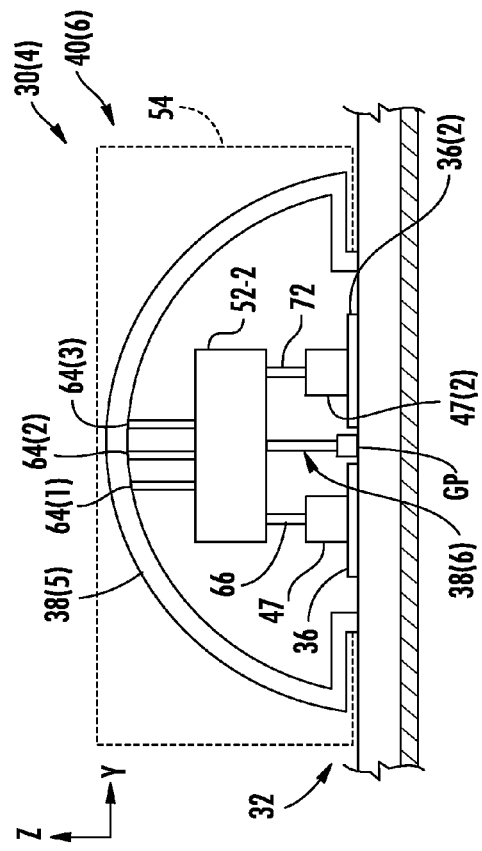
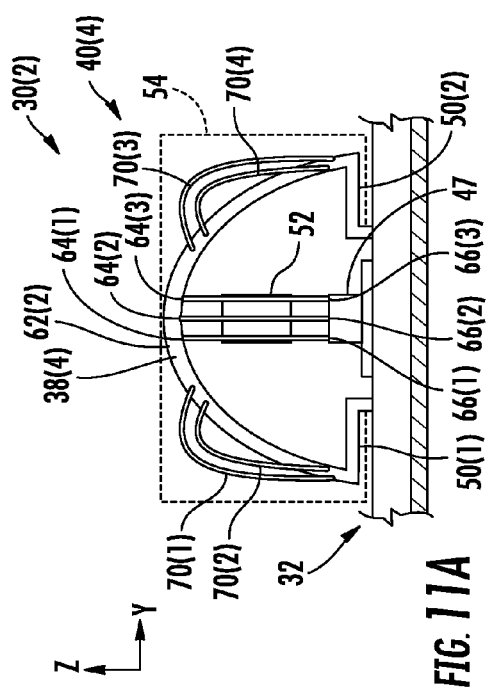
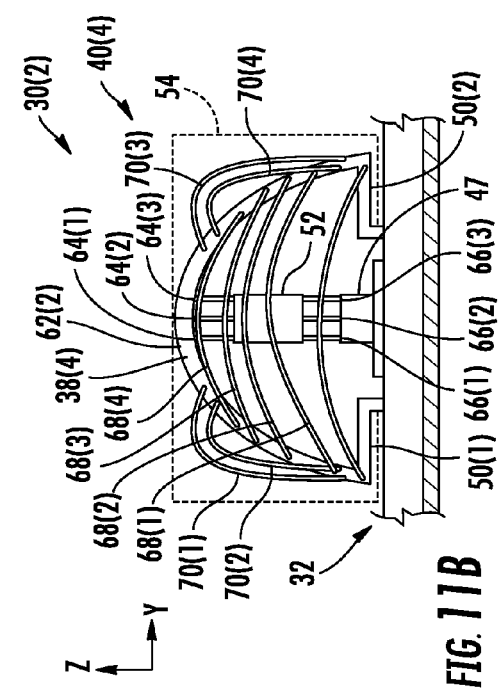

CONTROLLED-IMPEDANCE OUT-OF-SUBSTRATE PACKAGE STRUCTURES EMPLOYING ELECTRICAL DEVICES, AND RELATED ASSEMBLIES, COMPONENTS, AND METHODS

PRIORITY

This application claims the benefit of priority under 35 U.S.C. §119 of U.S. Provisional Application Ser. No. 61/653,632 filed on May 31, 2012 the content of which is relied upon and incorporated herein by reference in its entirety.

BACKGROUND

1. Field of the Disclosure

The technology of the disclosure relates to out-of-substrate package structures having electrical devices along with assemblies, wherein the out-of-substrate package structures may be mounted on electrical substrates and are advantageous for high-speed applications.

2. Technical Background

Benefits of communications networks having optical fibers supported by electrical components include extremely wide bandwidth and low noise operation for the optical signals transmitted on the optical fibers. However, these hybrid applications typically require converting the optical signal to an electrical signal and vice-versa. The electrical assemblies and devices used for converting signals between the optical and electrical domains and may be mounted upon an electrical substrate such as a printed circuit board or the like. The ability to convert data faster from optical signals to electrical signals and back again is needed as the demand increases for network speed, but as conversion speed increases obtaining a suitable signal becomes challenging. Consequently, current electrical devices electrically coupled on conventional out-of-substrate package structures mounted on electrical substrates are limited as to the speeds by which they can operate and still meet the desired specifications. As many of the applications of those conventional out-of-substrate package structures require large quantities of the out-of-substrate packages, improvements in the speed of transforming optical signals to electrical signals need to be cost effective while still meeting the desired performance. An example of one of the electrical devices may be, for example, an electro-optic device such as VCSELs or photodiodes on the out-of-substrate package that communicate with an optical fiber or the like.

FIG. 1 depicts a conventional technique to connect an electrical device 16 to a printed circuit board (PCB) 10 and into a position that is $L_1$ above the PCB 10. In this technique, a conventional lead frame comprising the ground lead 12 and the signal lead 14 may be created. The ground lead 12 and the signal lead 14 may be bent, then directly soldered to the PCB 10. The ground lead 12 may be connected to ground connection 18 of the PCB 10 and the signal lead 14 may be connected to a signal connection 20 of the PCB 10.

As depicted in FIG. 1, electric lines $e_1$ extending from the signal lead 14 terminate predictably on the ground lead 12 as shown by relatively linear electric line trajectories. In contrast, electric lines $e_2$ created on the signal lead 14 tend not to terminate on the ground lead 12, resulting in large deviations in impedance away from standard impedances, for example fifty (50) ohms. The termination of the $e_2$ lines is more difficult to control as electrical frequencies increase. In other words, a low-frequency electrical device is not as sensitive as a device operating at a frequency of five gigahertz (5 GHz) or more. When the impedance of the lead frame, including the electrical device 16, is not matched to the energy source then there is inefficient energy transfer between the electrical substrate, and the inefficiency of energy transfer is commensurate on the mismatch amount. The inefficient energy transfer manifests itself in signal reflections which may compromise signal integrity. Impedance matching between the PCB 10 and the electrical substrate becomes more important at higher signal speeds when impedance mismatches result in higher rates of signal reflections which degrades signal integrity below specifications.

In this regard, there is an unresolved need for improved approaches for assemblies and methods to electrically couple a high-speed electrical device to an electrical substrate, such as the PCB, in a cost effective manner.

SUMMARY OF THE DETAILED DESCRIPTION

Embodiments disclosed herein include controlled-impedance out-of-substrate package structures employing electrical devices, and related assemblies, components, and methods. An out-of-substrate package structure may be used to electrically couple an electrical device to an electrical substrate, for example a printed circuit board or the like. The out-of-substrate package structure may be electrically coupled to the electrical substrate. Ground paths of the out-of-substrate package structure may be arranged proximate to the electrical device and arranged symmetric with respect to at least one geometric plane intersecting the electrical device. In this regard, electric field lines generated by current flowing into the electrical device tend to terminate at the return or ground paths allowing for impedance to be more easily controlled. Accordingly, the out-of-substrate package structure may be impedance matched in a better way with respect to power and low-noise signal provided from the electrical substrate enabling faster electrical device speeds.

In this regard, in one embodiment, a controlled-impedance out-of-substrate package structure mountable on an electrical substrate is disclosed. The out-of-substrate package structure may include a signal path configured to be electrically coupled to a signal pad of the electrical substrate. The out-of-substrate package structure may also include ground paths configured to be electrically coupled to at least one ground plane of the electrical substrate. The out-of-substrate package structure may also include an electrical device configured to be electrically coupled to the signal path and to at least one of the ground paths. The ground paths may be arranged proximate to the electrical device and arranged symmetric with respect to at least one geometric plane intersecting the electrical device to control impedance. In this manner, as a non-limiting example, the out-of-substrate package structure may have a controlled-impedance configuration able to operate at higher signal speeds when mounted to the electrical substrate.

In another embodiment, an electrical system including a controlled-impedance out-of-substrate package structure mounted on an electrical substrate is disclosed. The out-of-substrate package structure may include a signal path electrically coupled to a signal pad of the electrical substrate. The out-of-substrate package structure may also include ground paths electrically coupled to at least one ground plane of the electrical substrate. The out-of-substrate package structure may also include an electrical device electrically coupled to the signal path and to at least one of the ground paths. The ground paths may be arranged proximate to the electrical device and arranged symmetric with respect to at least one geometric plane intersecting the electrical device to control impedance. In this manner, as a non-limiting example, the impedance of the out-of-substrate package structure may be controlled to match the power source and thereby operate at higher signal frequencies when converting optical and/or electrical signals.

In another embodiment, a method is disclosed of for mounting an out-of-substrate package structure on an electrical substrate to control impedance. The method may include arranging ground paths proximate to an electrical device and symmetric with respect to at least one geometric plane intersecting the electrical device to control impedance. The method may also include electrically coupling the electrical device to a signal path and to at least one of the ground paths. The method may further include electrically coupling the signal path to a signal pad of an electrical substrate. The method may also include electrically coupling the ground paths to at least one ground plane of the electrical substrate. In this manner, as a non-limiting example, the electrical device may be electrically coupled to the electrical substrate without many of the signal integrity issues associated with impedance mismatching between the out-of-substrate package structure and the electrical substrate.

In another embodiment, an electrical system, including a controlled-impedance out-of-plane package structure mounted on an electrical substrate is disclosed. The electrical system may include a first signal path electrically coupled to a first signal pad of an electrical substrate. The electrical system may comprise first ground paths electrically coupled to at least one ground plane of the electrical substrate. The electrical system may also include a first electrical device electrically coupled to the first signal path and to at least one of the first ground paths. The electrical system may also include a second signal path electrically coupled to a second signal pad of an electrical substrate. The electrical system may also include second ground paths electrically coupled to at least one ground plane of the electrical substrate. The electrical system may also include a connection electrically coupling at least one of the first ground paths and at least one of the second ground paths. The electrical system may also include a second electrical device electrically coupled to the second signal path and to at least one of the second ground paths. The first ground paths may be arranged proximate to the first electrical device and arranged symmetric with respect to at least one geometric plane intersecting the first electrical device to control impedance. The second ground path may be arranged proximate to the second electrical device and arranged symmetric with respect to at least one second geometric plane intersecting the second electrical device to control impedance. In this manner, as a non-limiting example, the electrical system may have multiple electrical devices in a controlled-impedance configuration and able to operate at higher signal speeds when mounted to the electrical substrate.

Additional features and advantages will be set forth in the detailed description which follows, and in part will be readily apparent to those skilled in the art from that description or recognized by practicing the embodiments as described herein, including the detailed description that follows, the claims, as well as the appended drawings.

It is to be understood that both the foregoing general description and the following detailed description present embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

BRIEF DESCRIPTION OF THE FIGURES

FIGS. 3A through 3D are a side, front, top, and rear view, respectively, of the first example of the out-of-substrate package structure of FIG. 2A;

FIGS. 4A through 4D are a side, front, top, and rear view, respectively, of the out-of-substrate package structure of FIGS. 3A through 3D with a housing of the out-of-substrate package structure hidden for clarity;

FIGS. 6A through 6D are a side, front, top and rear view, respectively, of a second example of an out-of-substrate package structure with the housing hidden for clarity;

FIGS. 8A through 8D are a side, front, top and rear view, respectively, of a third example of the out-of-substrate package structure;

FIGS. 9A through 9D are a side, front, top and rear view, respectively, of the out-of-substrate package structure of FIGS. 8A through 8D with a housing hidden;

FIG. 11A depicts a front view of a fourth example of an out-of-substrate package structure mounted on an electrical substrate and including stitch wire bonds;

FIG. 11B depicts a front view of the out-of-substrate package structure of FIG. 11A further including shield wire bonds;

FIG. 12 shows a front view of a fifth example of an out-of-substrate package structure mounted on an electrical substrate;

FIG. 12A shows a front view of sixth example of an out-of-substrate package structure with a ground path disposed between two differentially coupled signal paths mounted on an electrical substrate;

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein; rather, these embodiments are provided so that this disclosure will satisfy applicable legal requirements. Whenever possible, like reference numbers will be used to refer to like components or parts.

Embodiments disclosed herein include controlled-impedance out-of-substrate package structures employing electrical devices, and related assemblies, components, and methods. An out-of-substrate package structure is used for electrically coupling one or more electrical devices on the package structure to an electrical substrate, for example a printed circuit board (PCB). The out-of-substrate package structure may be electrically coupled to the electrical substrate such as for electrical-optical conversion or the like. The concepts disclosed herein are directed to ground paths for the out-of-substrate package structure that are arranged proximate to the electrical device and arranged symmetrically with respect to at least one geometric plane intersecting the electrical device. In this regard, electric field lines generated by current flowing into the electrical device tend to advantageously terminate at the return or ground paths allowing for impedance to be more easily managed or controlled, especially for high-speed application such as 5 Gigahertz (5 GHz) or greater. Accordingly, the out-of-substrate package structure may be impedance matched in a better way with respect to power provided from the electrical substrate enabling faster electrical device speeds.

Figure 1:
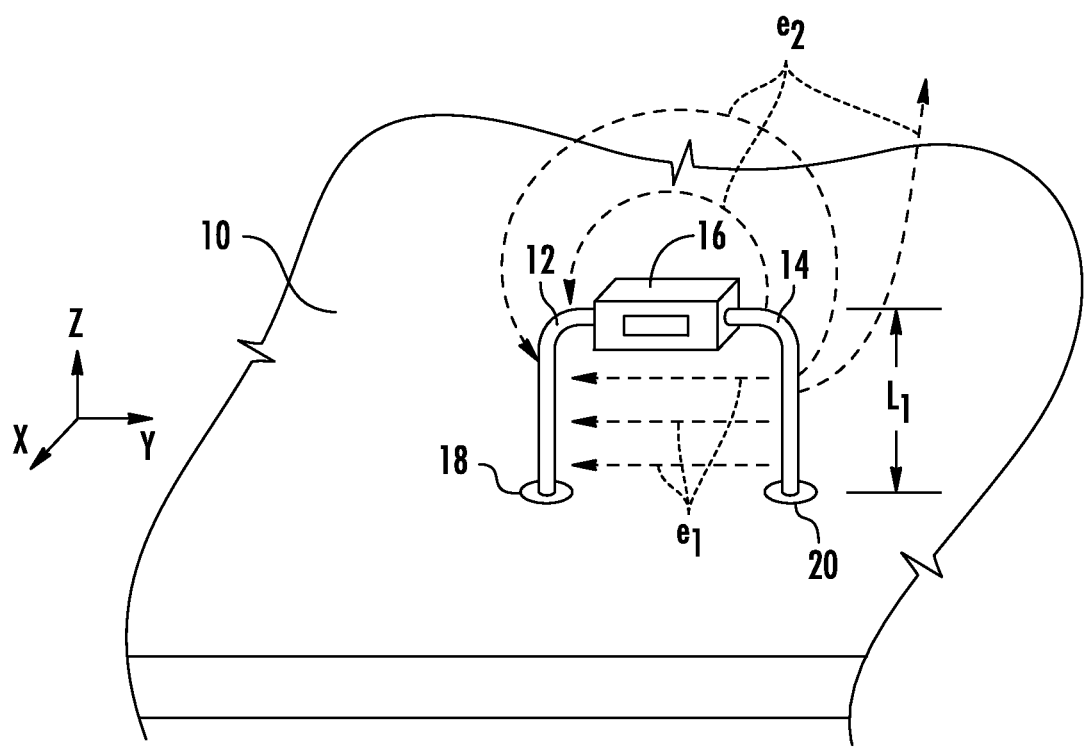
FIG. 1 illustrates a perspective view of a conventional technique for mounting an electrical device onto an electrical substrate in the prior art.
Figure 2A:
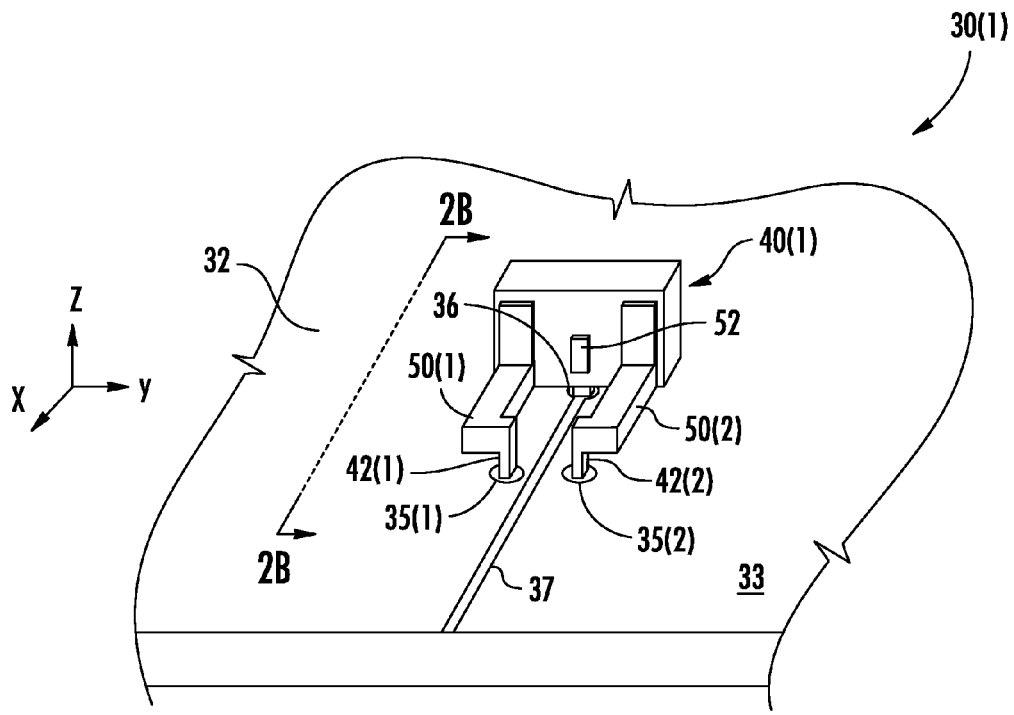
FIGS. 2A and 2B show a perspective view and a side view, respectively, of a first exemplary embodiment of an electrical system including a first example of an out-of-substrate package structure mounted to an electrical substrate.
Figure 2B:
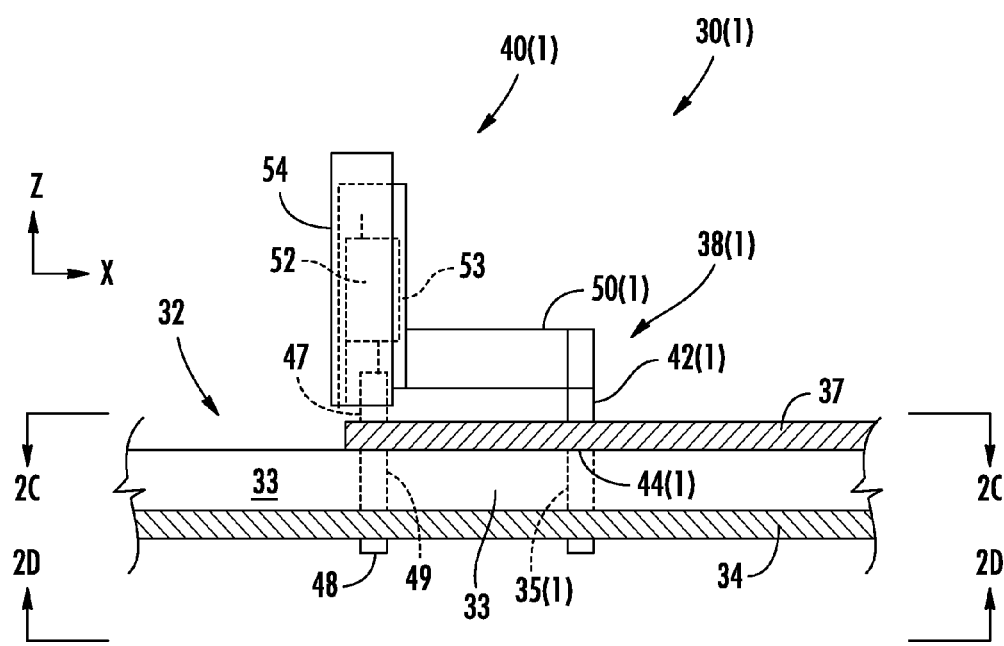

In this regard, FIGS. 2A and 2B show a perspective view and a side view, respectively, of a first embodiment of an electrical system 30(1). FIGS. 2A and 2B depict external features of the electrical system 30(1) which will be discussed first, and then internal features will be described. The internal features may be, for example, an electrical coupling between an electrical device 52 and at least one ground path 50(1), 50(2) and may be obscured by a dielectric housing 54.

The electrical system 30(1) may include an out-of-substrate package structure 40(1) configured to be electrically coupled to an electrical substrate 32. The electrical substrate 32 may be, for example, a printed circuit board (PCB). The externally observable features of the out-of-substrate package structure 40(1) may include the electrical device 52, a dielectric housing 54, the ground path 50(1), 50(2) of a ground path assembly 38(1), and a signal path 47.

The term "out-of-substrate package structure" refers to a package for the electrical device 52 for electrically coupling the electrical device 52 to the electrical substrate 32 while supporting the electrical device 52 in an orthogonal elevated distance from the electrical substrate 32. One embodiment of the out-of-substrate package structure is a "lead-frame" that is a sub-assembly having one or more electrical components attached to electrical connections of the lead-frame for electrically connecting the lead-frame to the electrical substrate.

By way of example, a "lead frame" may include a type of semiconductor chip package that may be mounted onto and electrically connected with the electrical substrate using through hole technology or solder mounted onto the electrical substrate 32 using surface mount technology. The main objectives of the lead frame may be to electrically couple, protect, and/or position an electrical device 52. The lead frame provide electrical coupling between a semiconductor chip or electrical device 52 and the electrical substrate 32 as well as contribute mechanical functions, for example, protection, orientation and the like.

In this regard, the out-of-substrate package structure 40(1) may include the dielectric housing 54 protect the electrical device 52 and its associated wire bonds 58(1)-58(2), 60(1)-60(2) (discussed later). The out-of-substrate package structure 40(1) allows for an offline first assembly of the electrical device 52. Once the out-of-substrate package structure 40(1) is attached to the electrical substrate 32 it may also orientate the electrical device 52 with respect to the electrical substrate 32. Orientation with respect to the electrical substrate 32 may be important in certain applications. If the electrical device 52 is, for example, an electro-optic device 53 (see FIG. 2B), then the orientation may enable more effective optical communication with other optical devices free of obstruction from the electrical substrate 32. By way of example, the out-of-substrate package structure 40(1) may be a lead-frame for aligning an optical fiber with a VCSEL or photodiode for making an electro-optical conversion and a ninety-degree turn with a relatively small-footprint such as in a connector body for an active optical cable (AOC) assembly.

With continuing reference to FIGS. 2A and 2B, the externally visible components of the out-of-substrate package structure 40(1) will be discussed in more detail. The electrical device 52 may receive power by, for example, being electrically coupled to at least one ground path 50(1), 50(2) and the signal path 47. The electrical device 52 may comprise, for example, the electro-optic device 53 including a vertical-cavity surface-emitting laser (VCSEL) and/or a photodetector.

Next, the dielectric housing 54 may provide mechanical protection from unintended contact and may be used as a spacer for holding an enclosure lid (not shown). The dielectric housing 54 may be configured not to interfere with the electrical performance of the out-of-substrate package structure 40(1). The dielectric housing 54 may comprise a dielectric material, for example, a thermoplastic. The dielectric housing 54 may be applied to the out-of-substrate package structure 40(1) with, for example, an overmold process.

Now the at least one ground path assembly 38(1) is described. The out-of-substrate package structure 40(1) may connect the electrical device 52 to the electrical substrate 32 with the ground path assembly 38(1) and the signal path 47. The ground path assembly 38(1) may be configured to electrically couple the electrical device 52 to ground on the electrical substrate 32. The ground path assembly 38(1) may comprise at least one ground path 50(1), 50(2). The at least one ground path 50(1), 50(2) may provide symmetry to the out-of-substrate package structure 40(1) as will be discussed later. The at least one ground path 50(1), 50(2) may each include at least one ground pin 42(1), 42(2), respectively. The ground pins 42(1), 42(2) may extend from the ground path 50(1), 50(2) and be configured to electrically couple the at least one ground path 50(1), 50(2), respectively, to at least one ground plane 34 of the electrical substrate 32.

With continuing reference to FIG. 2A and 2B, the signal path 47 may be configured to electrically couple the electrical device 52 to the signal pad 36 of the electrical substrate 32. The signal path 47 may be connected to the dielectric housing 54 which may hold the signal path 47 stationary with respect to the remainder of the out-of-substrate package structure 40(1).

The electrical substrate 32 may be configured to connect to the out-of-substrate package structure 40(1) utilizing through-hole technology for providing strong mechanical connections between the out-of-substrate package structure 40(1) and the electrical substrate 32. As shown in FIG. 2B, the electrical substrate 32 may include the ground plane 34 and a dielectric layer 33. The dielectric layer 33 may be disposed parallel to the ground plane 34. The ground plane 34 of the electrical substrate 32 may be electrically coupled to the at least one ground pin 42(1), 42(2). The ground via 44(1), 44(2) of the electrical substrate 32 may include at least one orifice 35(1), 35(2), respectively, to receive the ground pin 42(1), 42(2). It is noted that the ground pins 42(1), 42(2) and ground via 44(1), 44(2) may be modified for mounting to other embodiments (not shown) of the electrical substrate 32 using surface mount technology.

With continuing reference to FIGS. 2A and 2B, the electrical substrate 32 may also include signal pad 36, signal via 49, and microstrip 37. The signal pad 36 may be configured to be electrically coupled with the electrical device 52 through the signal path 47. The signal pad 36 may be electrically coupled with other components (not shown) mounted to the electrical substrate 32 through the microstrip 37. The microstrip 37 may be electrically coupled to the signal path 47 to thereby form a grounded coplanar wave guide (GCPW) transmission line section 80 (see FIG. 5B) in combination with the ground path 50(1), 50(2). The GCPW transmission line section 80 comprises the signal path 47 and the microstrip 37. For example, at least one dimension of the GCPW transmission line section 80 may be adjusted to control impedance. For example, the GCPW transmission line section 80 may be designed to match the impedance for the electrical system 30(1) against power provided to the electrical system 30(1) by the electrical substrate 32 instead of designing for minimum capacitance. In this manner, the electrical device 52 may efficiently operate at higher speeds.

Figure 2C:
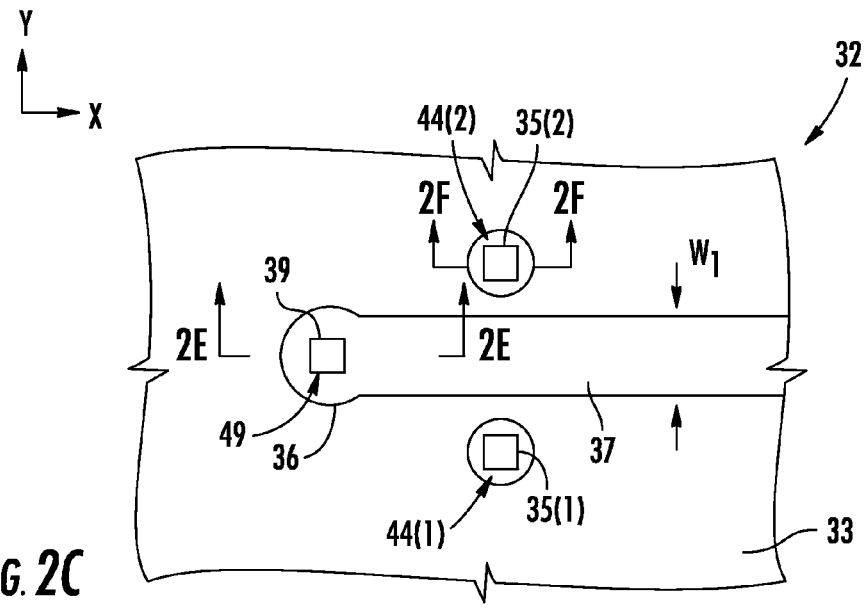
FIGS. 2C and 2D depict a top view and a bottom view, respectively, of the electrical substrate of FIGS. 2A and 2B with the out-of-substrate package structure of the electrical system hidden from view.
Figure 2D:
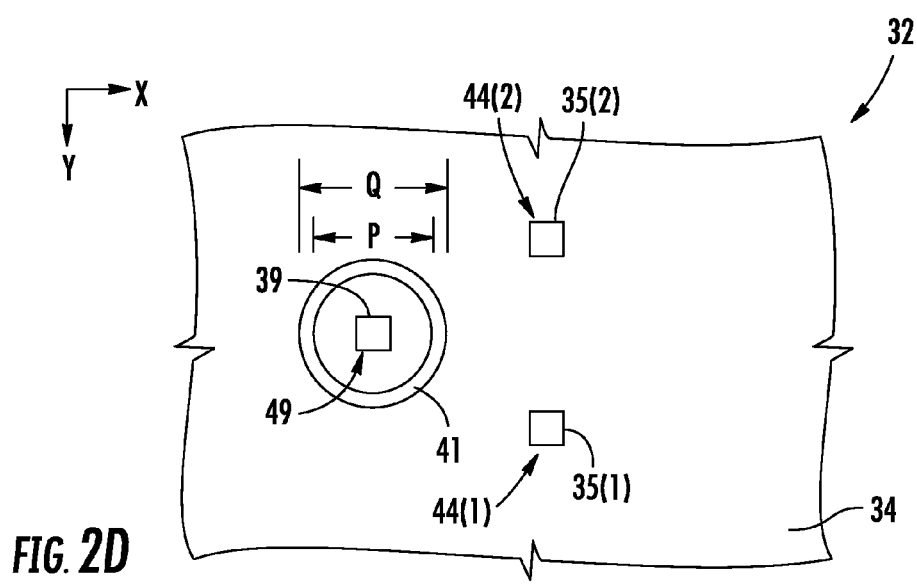
Figure 2E:
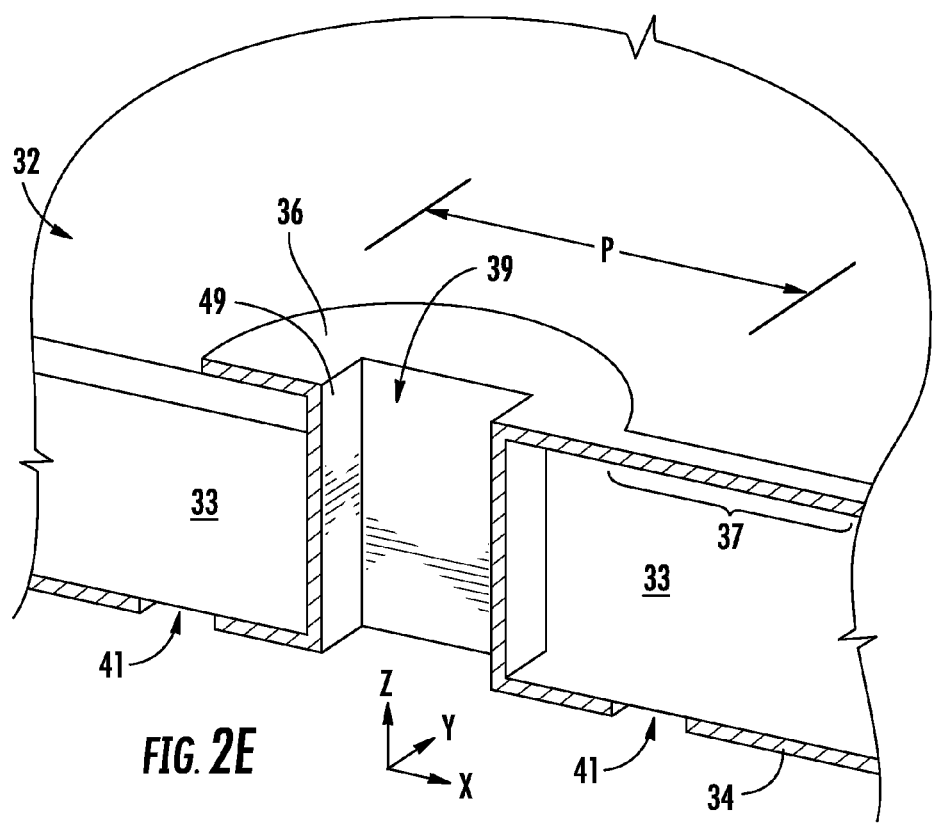
FIG. 2E is a perspective cut-away view of a signal via of the electrical substrate of FIG. 2C.
Figure 2F:
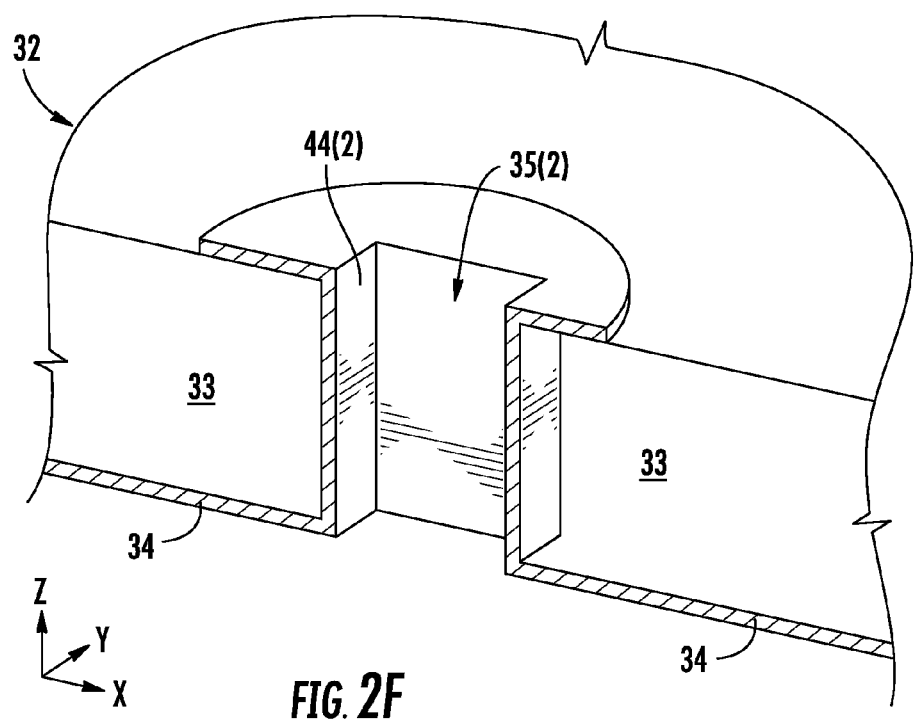
FIG. 2F is a perspective cut-away view of a ground via of the electrical substrate of FIG. 2C.

FIG. 2C through 2F depict various features of the electrical substrate 32 arranged to interface with the out-of-substrate package structure 40(1). FIG. 2C and 2D are a top view and a bottom view of the electrical substrate 32, respectively, with the out-of-substrate package structure 40(1) hidden from view. The signal pad 36 may be configured to be electrically coupled to the microstrip 37. The signal via 49 may have a diameter P as shown in FIGS. 2D and 2E. At least one of the diameter P may be disposed within a void of diameter Q in the ground plane 34 and separated by a gap 41 (see FIG. 2D). The gap 41 prevents the signal path 47 from shorting.

The signal via 49 of the electrical substrate 32 may include a signal orifice 39 to receive the signal path 47. It is noted that signal via 49 and signal path 47 may be modified for mounting to other embodiments (not shown) of the electrical substrate 32 using surface mount technology.

With continuing reference to FIGS. 2C and 2D, the electrical substrate 32 may include the at least one orifice 35(1), 35(2) of at least one ground via 44(1), 44(2) to receive the at least one ground pin 42(1), 42(2) respectively. The orifice 35(1), 35(2) may extend through the electrical substrate 32 to enable a strong mechanical connection between the out-of-substrate package structure 40(1) and the electrical substrate 32. It is noted that surface mount technology may alternatively be used to electrically couple the at least one ground pin 42(1), 42(2) to the at least one ground plane 34 in other embodiments (not shown) of the electrical substrate 32.

The signal via 49 and the ground via 44(1), 44(2) may have a rectangular cross-section as shown in FIGS. 2D and 2E. However, the signal via 49, the ground via 44(1), 44(2), signal path 47, and the ground pin 42(1), 42(2) may each have a cross-section of a different shape, for example, a circular shape. The shape of the signal via 49, the ground via 44(1), 44(2), the signal path 47 and the ground pin 42(1), 42(2) may be designed, for example, to maximize electrical efficiency and/or minimize manufacturing cost.

FIGS. 3A through 3D depict details of the out-of-substrate package structure 40(1) in a side view, front view, top view, and rear view, respectively with the dielectric housing 54 visible. At least a portion 55 of the ground path assembly 38(1) may extend from the dielectric housing 54 and be configured to electrically couple to the at least one ground plane 34 of the electrical substrate 32. The ground path assembly 38(1) may include the at least one ground path 50(1), 50(2) and the at least one ground pin 42(1), 42(2). The ground pin 42(1), 42(2) may extend from each of the at least one ground path 50(1), 50(2) to electrically couple with the ground plane 34.

Each of the at least one ground path 50(1), 50(2) may include distal end portions 56(1), 56(2). The distal end portions 56(1), 56(2) may extend toward each other to arrange the at least one ground path 50(1), 50(2) around the electrical device 52 and thereby provide convenient surfaces for the electric lines generated by the signal path 47 to terminate. The distal end portions 56(1), 56(2) may be free of contact from each other so as not to obstruct the electro-optic device 53 from optical communication.

The first surface 48 of the signal path 47 may extend from the dielectric housing 54 to be electrically coupled to the signal pad 36 of the electrical substrate 32. The signal path 47 enables the electrical device 52 to be elevated from the electrical substrate 32 and thereby better situated to communicate with the electrical device 52 (not shown).

FIGS. 4A through 4D depict the out-of-substrate package structure 40(1) with the dielectric housing 54 hidden from view for viewing the ground path. The ground path 50(1), 50(2) may be arranged proximate to the electrical device 52 and arranged symmetric with respect to at least one geometric plane $P_1$ intersecting the electrical device 52 to control impedance (See FIG. 4B). As shown collectively in FIGS. 4A and 4B, the electrical device 52 may be disposed between the ground path 50(1) and the ground path 50(2) to enable electric lines extending from the electrical device 52 to predictably terminate at the ground paths 50(1), 50(2). Simply stated, the ground paths he are symmetrically arranged about the electrical device within the out-of-substrate package (such as a lead-frame) in a plane such as a vertical plane so that the impedance at high-frequencies does not cause undue signal degradation.

As shown in FIG. 4A, each of the at least one ground path 50(1), 50(2) may be angled at an angle of θ (theta) to form a first portion 55 with a longitudinal axis $A_1$ and a second portion 57 with a longitudinal axis of $A_2$. The second portion 57 at the angle theta θ with respect to the first portion 55 enables the ground path 50(1), 50(2) to be arranged around the electrical device 52 to control impedance and allow operation at high frequencies compared with conventional configurations. The angled orientation of the first portion 55 with respect to the second portion 57 enables the electrical device 52 to be elevated an orthogonal distance from the electrical substrate 32. Moreover, the electro-optic device 53 may be supported in a position facing parallel to the electrical substrate 32 (See FIG. 4A). The angle θ (theta) may be, for example, ninety degrees. In this regard, the second portion 57 of the at least one ground path 50(1), 50(2) may be configured to be orthogonal to the electrical substrate 32.

The ground path 50(1), 50(2) may be configured to be electrically coupled to the electrical device 52 with at least one wire bond 58(1), 58(2) (see FIG. 4A). The wire bond 58(1), 58(2) may also be disposed between the ground path 50(1) and the ground path 50(2) as depicted collectively in FIGS. 4A and 4B. The at least one wire bond 58(1), 58(2) may comprise a conductive material, for example, copper. It is noted that the instead of the wire bond 58(1), 58(2), the electrical device 52 may be electrically coupled to the ground path 50(1), 50(2) with other electrical attachment mechanisms, for example, solder, silver paste, and/or mechanical means.

With continuing reference to FIG. 4A, the signal path 47 may electrically couple the electrical device 52 to the signal pad 36 of the electrical substrate 32. The signal path 47 may include the first surface 48 and a second surface 46 which may be angled to the first surface 48. The electrical device 52 may be configured to be electrically connected to the signal path 47 through the second surface 46. At least one wire bond 60(1), 60(2) may configure the electrical device 52 to be electrically coupled to the signal path 47. The at least one wire bond 60(1), 60(2) may comprise a conductive material, for example, copper. It is noted that the instead of the wire bond 60(1), 60(2), the electrical device 52 may be electrically coupled to the signal path 47 with other electrical attachment mechanisms, for example, solder, silver paste, and/or mechanical means.

Figure 5A:
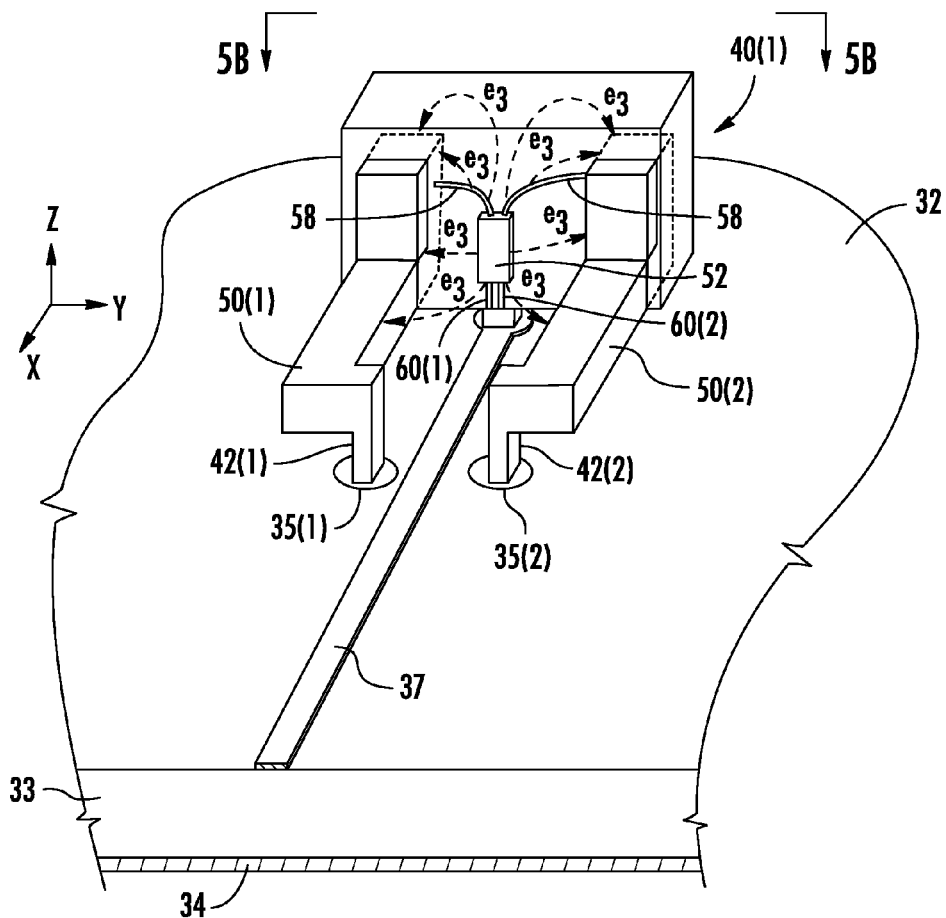
FIG. 5A is a perspective view of the out-of-substrate package structure of FIGS. 3A through 3D operating on an electrical substrate with electric lines shown.

FIG. 5A shows a perspective view of the out-of-substrate package structure 40(1) electronically coupled and operating on the electrical substrate 32. Electric line trajectories $e_3$ extend from the at least one wire bond 58(1)-58(2), 60(1)-60(2) and the electrical device 52 to the at least one ground path 50(1), 50(2) where the electric line trajectories $e_3$ terminate. The electric line trajectories $e_3$ may be symmetric with respect to at least one geometric plane $P_1$ (FIG. 4B) because the at least one ground path 50(1) 50(2) where the electric line trajectories $e_3$ terminate may be proximate to the electrical device 52 and symmetric with respect to the geometric plane $P_1$ intersecting the electrical device 52. Symmetric electric field lines $e_3$ are easier to model than non-symmetric electric line trajectories because the behavior of the electric line trajectories $e_3$ predictably terminate on the ground path 50(1), 50(2) and provide better electrical performance at high-speeds. Thus the impedance of the electrical device 52 may be matched to the power source available on the electrical substrate 32 to operate at higher speeds than conventional configurations.

Figure 5B:
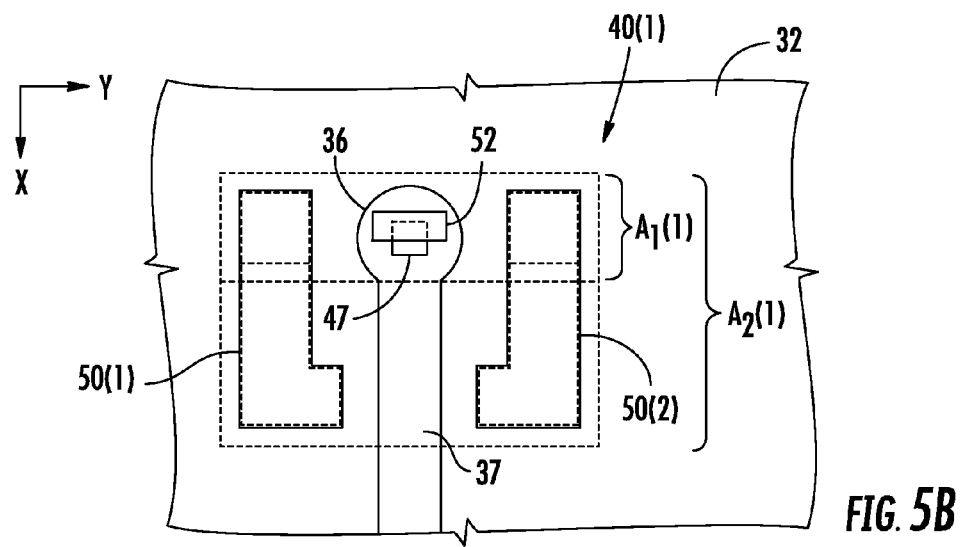
FIG. 5B is a top view of the out-of-substrate package structure of FIGS. 3A through 3D mounted to the electrical substrate with first and second proximity areas identified.

FIG. 5B is a top view of the ground path 50(1), 50(2) of the out-of-substrate package structure 40(1) depicted in FIG. 5A superimposed on the electrical substrate 32. The electrical device 52, signal pad 36, and signal path 47 may be disposed within an area $A_1(1)$ between the ground path 50(1) and the ground path 50(2). The electric lines generating from electrical device 52, signal pad 36, and signal path 47 are thereby more predictably terminated on the ground path 50(1) and the ground path 50(2) according to the concepts disclosed herein.

It is also noted that a footprint area $A_2(1)$ of the out-of-substrate package structure 40(1) superimposed on the electrical substrate 32 may also include some of the microstrip 37. Also, the longitudinal axis $A_1$ of the portion of the ground path 50(1), 50(2) may be parallel to and proximate to the microstrip 37 as shown in FIG. 5B. The electric lines generating from microstrip 37 may be thereby more predictably terminated on the ground path 50(1) and the ground path 50(2) and improve high-speed performance.

FIGS. 6A through 6D depict a second embodiment of the out-of-substrate package structure 40(2) in a side view, front view, top view, and rear view, respectively. In this second embodiment, the dielectric housing 54 and external features may be similar to the first embodiment and will not be repeated for brevity (see FIGS. 3A through 3D). The main differences of the out-of-substrate package structure 40(2) in comparison to the out-of-substrate package structure 40(1) is that a ground path assembly 38(2) may comprise a ground arch 62(1) which connects the at least one ground path 50(1), 50(2) (FIG. 6C). The ground arch 62(1) may be arranged proximate to the electrical device 52 and symmetric with respect to one of at least one geometric plane $P_2$ intersecting the electrical device 52 (see FIG. 6B). The ground arch 62(1) provides additional impedance control because the electric lines produced by the electric coupling of the electrical device 52 may be more predictably terminated at the ground arch 62(1). In other words, the ground arch provides a continuous ground path by connecting ground paths 50(1) and 50(2) with the ground arch 62(1) to form a continuous ground path about the electrical device.

Figure 7A:
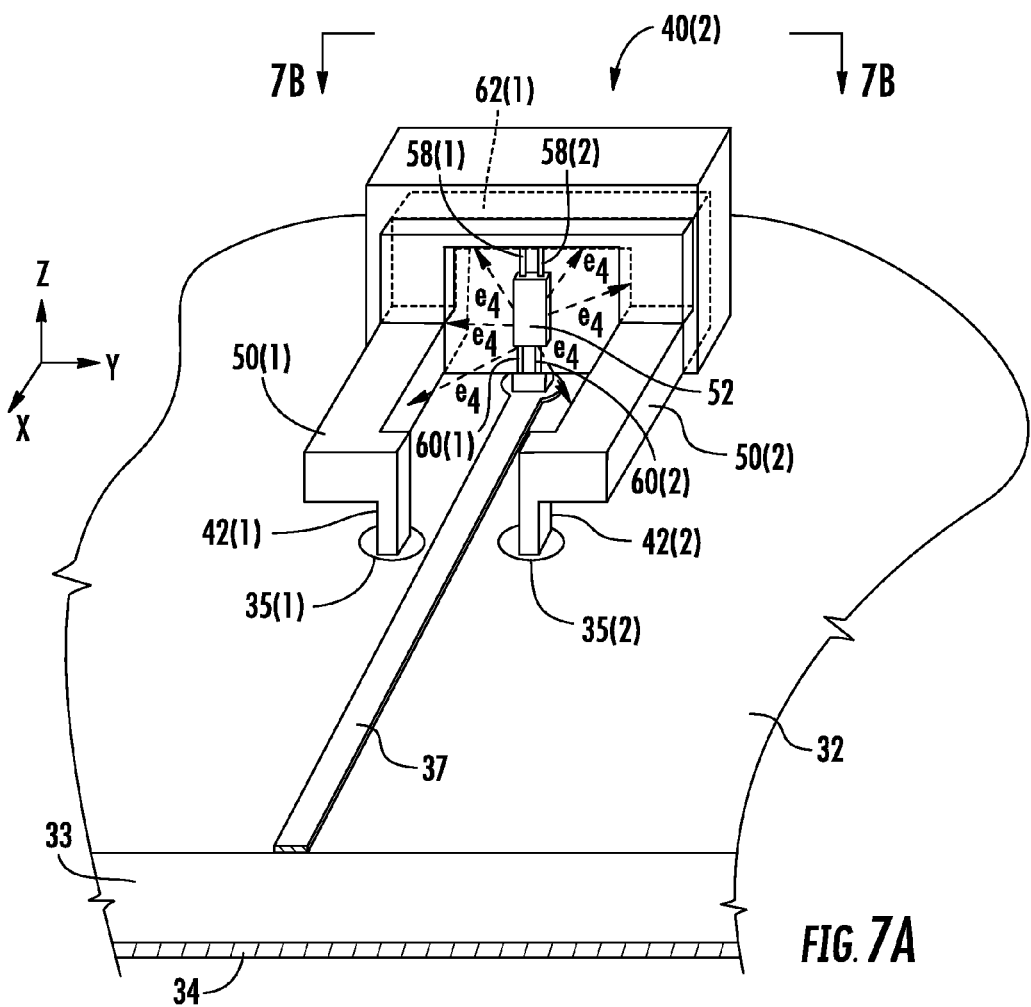
FIG. 7A is a perspective view of the out-of-substrate package structure of FIGS. 6A through 6D operating on an electrical substrate with electric lines visible.

Specifically, as shown in FIG. 7A, which is a perspective view of the out-of-substrate package structure 40(2) electrically coupled and operating on an electrical substrate 32, electric line trajectories $e_4$ extend from the at least one wire bond 58(1)-58(2), 60(1)-60(2) and the electrical device 52 to terminate at the at least one ground path 50(1), 50(2), and the ground arch 62(1). The electric line trajectories $e_4$ may be symmetric with respect to at least one geometric plane $P_2$ (FIG. 6B) because the at least one ground path 50(1), 50(2) and the ground arch 62(1) may be arranged symmetric with respect to the geometric plane $P_2$ intersecting the electrical device 52. More control and predictability over the electric line trajectories $e_4$ is possible with the ground arch 62(1) as seen in FIG. 7A since the lines are likely to terminate on the ground path. In this regard, symmetric electric lines $e_4$ are easier to model than the electric field lines $e_4$ of the out-of-substrate package structure 40(2). Thus, the impedance of the electrical device 52 may be even better matched to the power source available on the electrical substrate 32 and thereby operate at even higher speeds such as 10 Gigahertz (10 GHz).

Figure 7B:
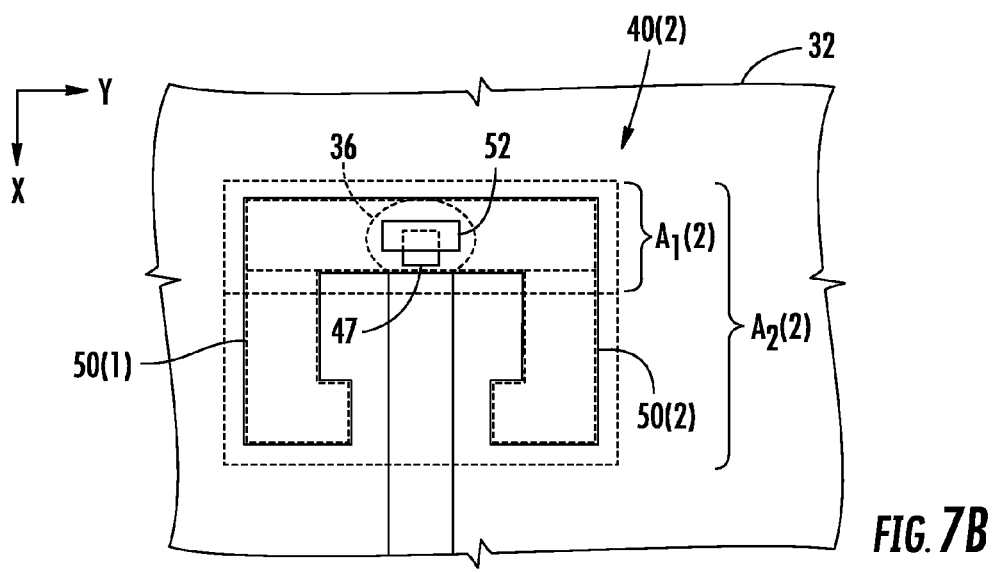
FIG. 7B is a top view of the out-of-substrate package structure of FIGS. 6A through 6D mounted to the electrical substrate with first and second proximity areas identified.

FIG. 7B is a top view of the ground path 50(1), 50(2) of the out-of-substrate package structure 40(2) depicted in FIG. 7A superimposed on the electrical substrate 32. The electrical device 52, signal pad 36, and signal path 47 may be disposed within an area $A_1(2)$ between the ground path 50(1) and the ground path 50(2). The electric lines generating from electrical device 52, signal pad 36, and signal path 47 may be thereby more predictably terminated on the ground path 50(1) and the ground path 50(2).

It is also noted that a footprint area $A_2(2)$ of the out-of-substrate package structure 40(2) superimposed on the electrical substrate 32 may also include some of the microstrip 37 as before. Also, the longitudinal axis $A_1$ of the portion of the ground path 50(1), 50(2) may be parallel to and proximate to the microstrip 37 as shown in FIG. 7B. The electric lines generating from microstrip 37 may be thereby more predictably terminated on the ground path 50(1) and the ground path 50(2).

FIGS. 8A through 8D depict a third embodiment of the out-of-substrate package structure 40(3) with the dielectric housing 54(3) visible in a side view, front view, top view, and rear view, respectively. In this embodiment, each of the at least one ground path 50(1), 50(2) may include second curved surfaces 63(1), 63(2) arranged symmetrically with respect to at least one geometric plane intersecting and at least partially facing the electrical device 52 for controlling impedance. The second curved surfaces 63(1), 63(2) enable the at least one ground path 50(1), 50(2) to be arranged in closer proximity to the electrical device 52 and thereby better terminate the electrical lines generated by the electrical coupling of the electrical device 52.

FIGS. 9A through 9D depict the out-of-substrate package structure 40(3) in a side view, front view, top view, and rear view, respectively, with the dielectric housing 54(3) hidden from view. The ground arch 62(2) may include a curved surface 65 (FIG. 9B) that may at least partially face the electrical device 52. The curved surface 65 may advantageously enable the ground arch 62(2) to be arranged in a more uniformly equidistant proximity to the electrical device 52 and thereby more predictably terminate the electrical lines generated by the electrical coupling of the electrical device 52. More predictable electrical lines enable the impedance of the out-of-substrate package structure 40(3) to be better matched against the power supplied by the electrical substrate 32 and providing the desired performance.

Figure 10A:
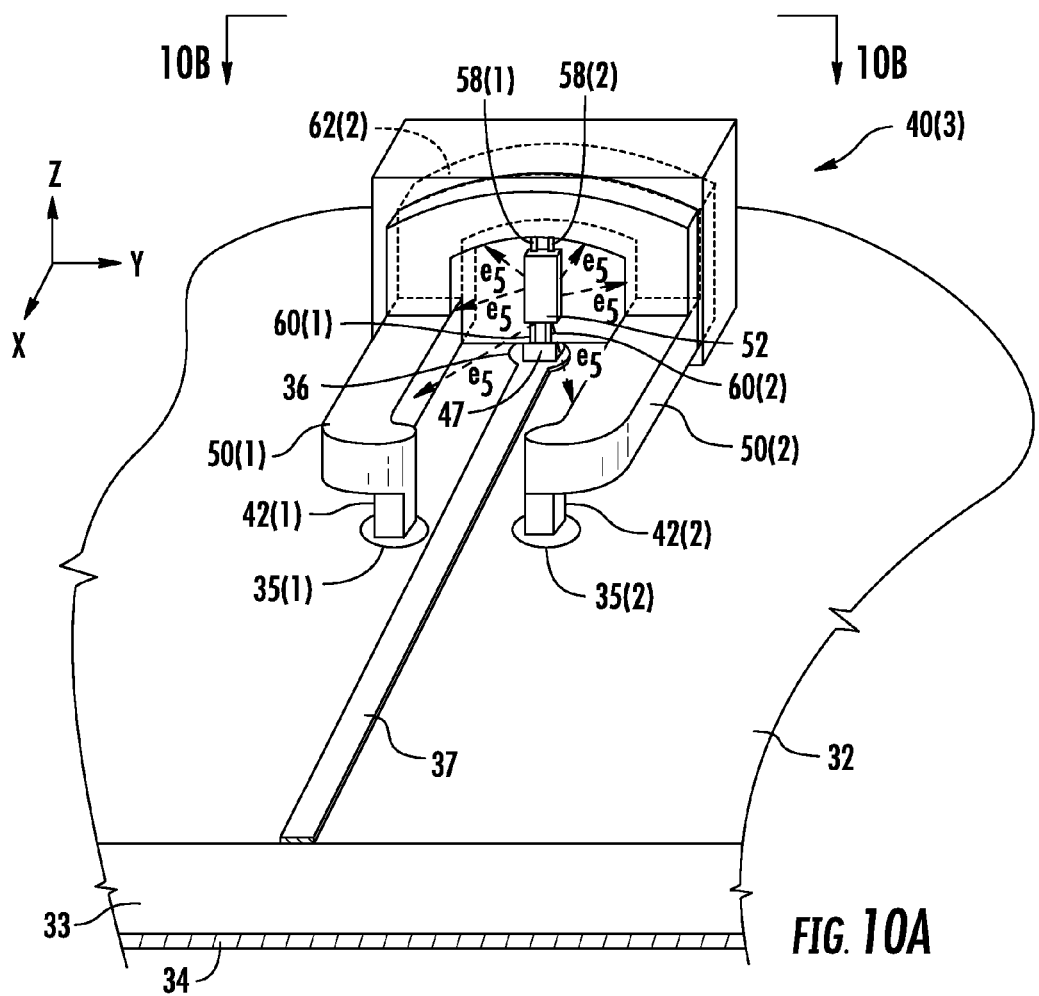
FIG. 10A is a perspective view of the out-of-substrate package structure of FIGS. 9A through 9D with electric lines visible.

Specifically, FIG. 10A shows when the out-of-substrate package structure 40(3) may be electrically coupled and operating on the electrical substrate 32, electric line trajectories $e_5$ may extend from the at least one wire bond 58(1)-58(2), 60(1)-60(2) and the electrical device 52 to be terminated at the ground path 50(1), 50(2). The electric line trajectories $e_5$ may be symmetric with respect to the at least one geometric plane $P_3$ (FIG. 9B) because the at least one ground path 50(1), 50(2) where the electric line trajectories $e_5$ terminate may be arranged symmetric with respect to the geometric plane $P_3$. Symmetric field lines $e_5$ are easier to model than the electric line trajectories discussed earlier for the earlier embodiments of the out-of-substrate package structures 40(1), 40(2) because the behavior of the electric line trajectories $e_5$ predictably terminate on the curved surface 65 and second curved surfaces 63(1), 63(2) of the ground paths 50(1), 50(2). In this regard, the impedance of the electrical device 52 may be better matched to the power source available on the electrical substrate to operate at even higher speeds.

It is noted that the electrical device 52 may be co-planar with and disposed between the ground path 50(1) and the ground path 50(2) as shown by a geometric plane $P_4$ (FIG. 9B). This co-planar arrangement with respect to the geometric plane $P_4$ allows for the electric line trajectories $e_5$ to also be co-planar and more easily modeled and understood. In this regard, the impedance of the electrical device 52 may be better matched to the electrical substrate 32 and thereby may be designed to operate at higher signal speeds without unacceptable signal reflections that may compromise signal integrity and degrade performance.

Figure 10B:
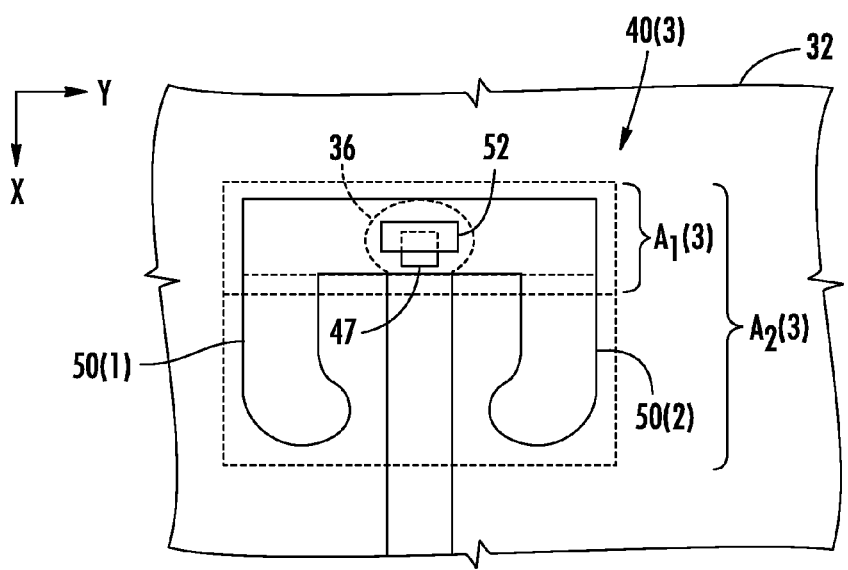
FIG. 10B is a top view of the out-of-substrate package structure of FIGS. 8A through 8D mounted to the electrical substrate with first and second proximity areas identified.

FIG. 10B is a top view of the ground path 50(1), 50(2) of the out-of-substrate package structure 40(3) depicted in FIG. 10A superimposed on the electrical substrate 32. The electrical device 52, signal pad 36, and signal path 47 may be disposed within an area $A_1(3)$ between the ground path 50(1) and the ground path 50(2). The electric lines generating from electrical device 52, signal pad 36, and signal path 47 may be thereby more predictably terminated on the ground path 50(1) and the ground path 50(2).

It is also noted that a footprint area $A_2(3)$ of the out-of-substrate package structure 40(3) superimposed on the electrical substrate 32 may also include some of the microstrip 37 as before. Also, the longitudinal axis $A_1$ of the portion of the ground path 50(1), 50(2) may be parallel to and proximate to the microstrip 37 as shown in FIG. 10B. The electric lines generating from microstrip 37 may be thereby more predictably terminated on the ground path 50(1) and the ground path 50(2).

FIGS. 11A and 11B show a fourth embodiment which is out-of-substrate package structure 40(4) mounted upon the electrical substrate 32, similar to the other embodiment. Unlike earlier embodiments, the out-of-substrate package structure 40(4) include multiple wire bonds 66(1)-66(3) configured to couple the electrical device 52 to the signal path 47 and multiple wire bonds 64(1)-64(3) configured to couple the electrical device 52 to the ground arch 62(2). These additional wire bonds 64(1)-64(3) and 66(1)-66(3) enable the impedance to be better controlled by enabling the current to be more predictable through the electrical device 52 may provide further performance improvements.

Shield wire bonds 68(1), 68(2), 68(3), 68(4) may be connected between various portions of the ground arch 62(2) and/or at least one ground path 50(1), 50(2) to symmetrically span across the electrical device 52. The shield wire bonds 68(1)-68(4) span across the electrical device 52 and form a mesh-like conductive structure above the electrical device 52. The shield wire bonds 68(1)-68(4) assist in shielding the electrical device 52 from external electro-magnetic interference as well as help the electrical device 52 adhere to limits of electro-magnetic radiated emissions. The shield wire bonds 68(1), 68(2), 68(3), 68(4) may comprise a conductive material, for example, copper. The shield wire bonds 68(1), 68(2), 68(3), 68(4) may better control the impedance of the electrical system 30(2) by making available more conductive material arranged around the electrical device 52 for electric lines generated by the electrical device 52 to terminate.

Stitch wire bonds 70(1), 70(2), 70(3), 70(4) may also be connected between various portions of the ground arch 62(2) and/or at least one ground path 50(1), 50(2). The stitch wire bonds 70(1), 70(2), 70(3), 70(4) may collectively be symmetrically arranged around the electrical device 52, but each of the stitch wire bonds 70(1), 70(2), 70(3), 70(4) may not cross over the electrical device 52. The stitch wire bonds 70(1), 70(2), 70(3), 70(4) may also better control the impedance of the electrical system 30(2) by making available more conductive material arranged around the electrical device 52 for electric lines generated by the electrical device 52 to terminate.

FIG. 12 shows a fifth embodiment which is out-of-substrate package structure 40(5) mounted upon the electrical substrate 32 using the concepts disclosed herein. The result is electrical system 30(3). The fifth embodiment is different from the out-of-substrate package structure 40(4) because an electrical device 52(2) may also be electrically coupled to a second signal path 47(2) and a second signal pad 36(2). Thus, the second signal path 47(2) and second signal pad 36(2) are differentially coupled, to the first signal path 47 and a signal pad 36 respectively as would be the case in a differential impedance ground-signal-signal-ground (G-S-S-G) configuration. It is also noted that the electrical device 52-2 may be electrically coupled to a first signal path 47 and a second signal path 47(2) with the at least one wire bond 66 and at least one wire bond 72 respectively. The second signal pad 36(2) may increase bandwidth of the electrical system 30(3) by enabling the electrical device 52(2) to have multiple signal paths 47, 47(2) for receiving and transmitting signals.

FIG. 12A shows a sixth embodiment having the out-of-substrate package structure 40(6) mounted upon the electrical substrate 32 using the concepts disclosed herein. The result is electrical system 30(4). The sixth embodiment is similar to the fifth embodiment, but the out-of-substrate package structure 40(6) further includes a ground path 38(6) disposed between two differentially coupled signal paths 47, 47(2) in this embodiment. Specifically, electrical substrate 32 includes a ground pad GP disposed between the two differentially coupled signal paths 47, 47(2) and electrically attached to the ground path 38(6). Consequently, the electrical system 30(4) has a ground-signal-ground-signal-ground (G-S-G-S-G) differential impedance configuration.

Figure 13:
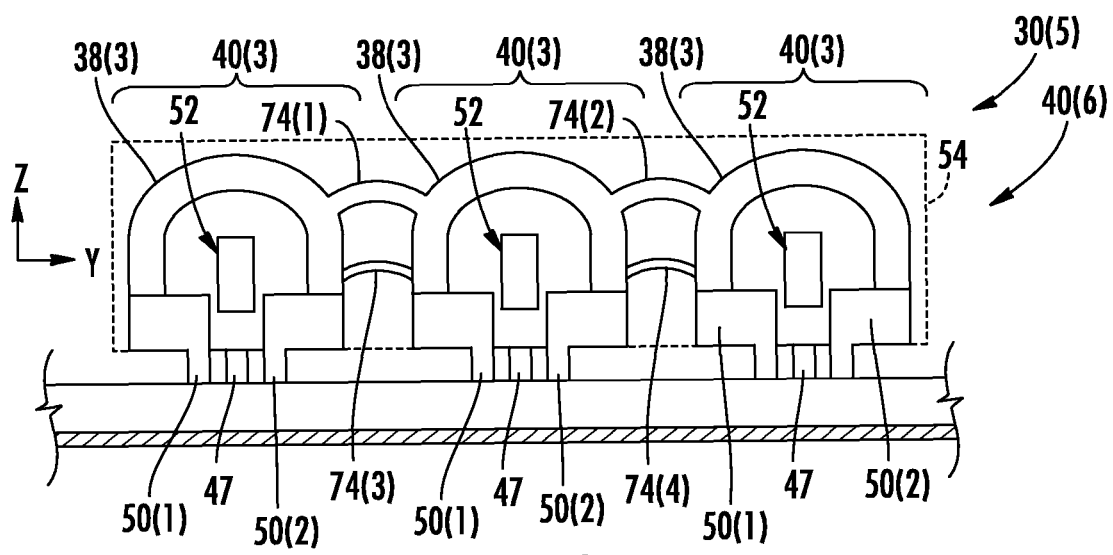
FIG. 13 illustrates a front view of a seventh example of an out-of-substrate package structure mounted on an electrical substrate.

FIG. 13 shows a seventh embodiment which is out-of-substrate package structure 40(7) mounted upon the electrical substrate 32 according to the concepts disclosed herein. The result is electrical system 30(5). The seventh embodiment is different from earlier embodiments because the out-of-substrate package structure 40(7) comprises at least two of the out-of-substrate package structures 40(3). Each of the out-of-substrate package structures 40(3) includes ground path assemblies 38(3) which each comprise the at least one ground path 50(1), 50(2) and/or ground arches 62(2). The ground path assemblies 38(3) may be electrically coupled with at least one connection 74(1), 74(2), 74(3), 74(4). The connection 74(1), 74(2) may comprise an inter-ground-arch linker which integral with the ground path assembly 38(3). Alternatively the connection 74(3), 74(4) may comprise wire bonds.

Each of the out-of-substrate package structures 40(3) may also be enclosed within the dielectric housing 54. The multiple of the out-of-substrate package structures 40(3) may increase bandwidth of the electrical system 30(4) by providing more than one signal path 47 and more than one electrical device 52 for receiving signals and transmitting signals.

Figure 14:
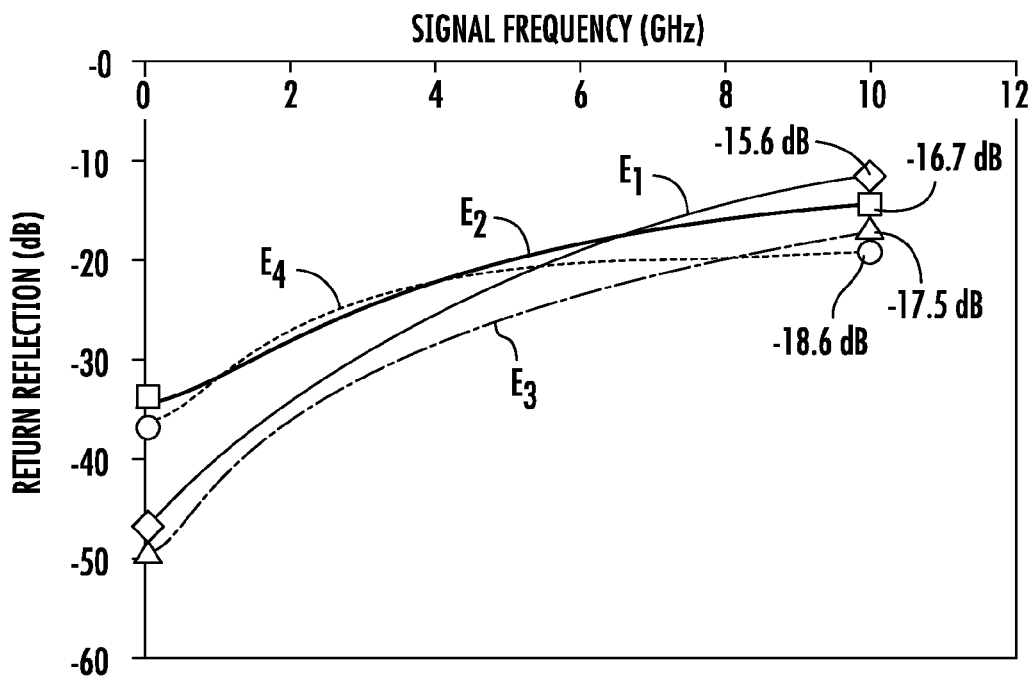
FIG. 14 is a line graph of return reflection against signal frequency for the out-of-substrate package structures of FIGS. 5A, 7A, 10A, and 11A.

FIG. 14 is a graph of return reflection (S11 parameter) against signal frequency in GigaHertz (GHz) calculated for several different embodiments disclosed herein. Return reflection (S11 parameter) is a measure of the ability for an electrical system 30 to operate satisfactorily. Return reflection values within 15 dB of zero are unacceptable performance for an electrical system 30. As the frequency increases, the return reflection (S11 parameter) approaches zero and reflection rates worsen. The first example in FIG. 5A is represented by curve $E_1$, the second example in FIG. 7A is represented by curve $E_2$, the third example in FIG. 10A is represented by curve $E_3$, and fourth example in FIG. 11A is represented by curve $E_4$. As shown, the out-of-substrate package structure 40 were progressively better in terms of the S11 parameter at the highest operating speed calculated of ten gigahertz (10 GHz). Specifically, the fourth example represented by curve $E_4$ had the best measurement at −18.6 decibels. The third example $E_3$ was measured at a second best value of −17.5 decibels. The second example $E_2$ had a value of −16.7 decibels. The first example $E_1$ was measured at a worst value of −15.6 decibels. Conventional designs typically would not have acceptable performance at 10 GHz, thus the concepts of the present application provide a significant improvement in the art.

Figure 15:
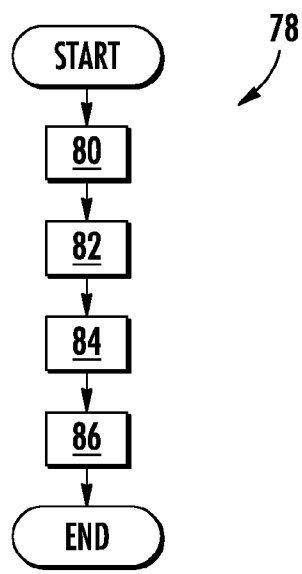
FIG. 15 is an exemplary process for mounting an out-of-substrate package structure to an electrical substrate.

FIG. 15 provides an exemplary process 78 for mounting the out-of-substrate package structure 40(3) on an electrical substrate 32. The process in FIG. 15 will be described using the terminology and information provided above. The first step in the process may be to arrange the at least one ground path 50(1), 50(2) symmetrically around the electrical device 52 in at least one geometric plane to control impedance (step 80 in FIG. 15). Next, the electrical device 52 may be electrically coupled to the signal path 47 and electrically coupled to the at least one ground path 50(1), 50(2) (step 82 in FIG. 15). The electrical coupling may be accomplished by connecting the electrical device 52 and the signal path 47 with the at least one wire bond 60(1), 60(2) and the electrical device 52 and the at least one ground path 50(1), 50(2) with the at least one wire bond 58(1), 58(2). In the case when the out-of-substrate package structure 40(3) includes the ground arch 62, then the at least one ground path 50(1), 50(2) may be electrically coupled to the electrical device 52 by attaching the at least one wire bond 58(1), 58(2) between the ground arch 62 and the electrical device 52. The at least one ground path 50(1), 50(2) may be connected with the ground arch 62(2) and arranged symmetrically with respect to one of the at least one geometric plane $P_1$. The second curved surfaces 63(1), 63(2) of each of the at least one ground path 50(1), 50(2) may be arranged to at least partially face the electrical device 52. The curved surface 65 of the ground arch 62(2) may be arranged to at least partially face the electrical device 52. The second curved surfaces 63 of each of the at least one ground path 50(1), 50(2) may also be arranged to at least partially face the electrical device 52.

Next, the dielectric housing 54 may be applied to the at least one ground path 50(1), 50(2), at least one wire bond 58(1)-58(2), 60(1)-60(2), and signal path 47 to hold them stationary to one another (step 84 in FIG. 15). The dielectric housing 54 may be applied using, for example, an overmold process. It is noted that an order of assembly may be modified by those skilled in the art.

Next, the signal path 47 may be electrically coupled to a signal pad 36 of the electrical substrate 32 and the at least one ground path 50(1), 50(2) may be electrically coupled to the ground plane 34 of the electrical substrate 32 (step 86 in FIG. 15).

Directions x, y, and z are identified in the figures of this disclosure. The letter x points to the front, the letter y points to the right, and the letter z points up. The directions are included for consistently between figures and do not necessarily imply a relationship or orientation between the out-of-substrate package structure 40(1), 40(2), 40(3), 40(4), and/or 40(5) and the electrical substrate 32.

Many modifications and other embodiments of the embodiments disclosed herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

We claim:

1. A controlled-impedance out-of-substrate package structure mountable on an electrical substrate, comprising:
    a signal path configured to be electrically coupled to a signal pad of an electrical substrate;
    ground paths configured to be electrically coupled to at least one ground plane of the electrical substrate; and
    an electrical device configured to be electrically coupled to the signal path and to at least one of the ground paths,
    wherein the ground paths are arranged proximate to the electrical device and arranged symmetric with respect to at least one geometric plane intersecting the electrical device to control impedance, and wherein the ground paths are connected by a ground arch arranged proximate to the electrical device and symmetric with respect to the at least one geometric plane intersecting the electrical device to control impedance.

2. The out-of-plane package structure of claim 1, wherein the electrical device is disposed between the ground paths.

3. The out-of-plane package structure of claim 1, wherein the signal path comprises a first wire bond and the ground paths include a second wire bond, and the first wire bond and the second wire bond electrically couple the signal path and the ground paths respectively to the electrical device.

4. The out-of-plane package structure of claim 3, wherein the first wire bond and second wire bond are disposed between the ground paths.

5. The out-of-plane package structure of claim 1, wherein a longitudinal axis of at least a portion of each of the ground paths is orthogonal to the electrical substrate.

6. The out-of-plane package structure of claim 1, wherein the ground arch is configured to be electrically coupled to the electrical device with at least one wire bond.

7. The out-of-plane package structure of claim 1, wherein the ground arch includes a curved surface at least partially facing the electrical device.

8. The out-of-plane package structure of claim 7, wherein each of the ground paths include second curved surfaces at least partially facing the electrical device.

9. An electrical system, including a controlled-impedance out-of-substrate package structure mounted on an electrical substrate, the out-of-substrate package structure comprising:
   a signal path electrically coupled to a signal pad of the electrical substrate;
   ground paths electrically coupled to at least one ground plane of the electrical substrate; and
   an electrical device electrically coupled to the signal path and to at least one of the ground paths,
   wherein the ground paths are arranged proximate to the electrical device and arranged symmetric with respect to at least one geometric plane intersecting the electrical device to control impedance, and
   wherein at least one longitudinal axis of a portion of the ground paths is parallel to a microstrip of the electric substrate, the microstrip is electrically coupled to the signal path forming a grounded coplanar wave guide (GCPW) transmission line section including the signal path and the microstrip, and at least one dimension of the GCPW transmission line section is adjusted to control impedance.

10. The electrical system of claim 9, wherein the electrical device is disposed between the ground paths.

11. The electrical system of claim 9, wherein the signal path comprises a first wire bond and the ground paths include a second wire bond, and the first wire bond and the second wire bond electrically couple the signal path and the ground paths respectively to the electrical device.

12. The electrical system of claim 9, wherein a longitudinal axis of at least a portion of each of the ground paths is orthogonal to the electrical substrate.

13. The electrical system of claim 9, wherein the signal path comprises a first surface and a second surface, the first surface is electrically coupled to the signal pad of the electrical substrate, and the second surface is electrically coupled to the electrical device by wire bonds.

14. The electrical system of claim 13, wherein the signal path is electrically coupled to the signal pad of the electrical substrate and a signal via of the electric substrate.

15. The electrical system of claim 9, wherein the ground paths are connected by a ground arch arranged proximate to the electrical device and symmetric with respect to the at least one geometric plane intersecting the electrical device to control impedance.

16. The electrical system of claim 9, wherein the portion of the ground paths is proximate to the microstrip of the electric substrate and symmetric with respect to the at least one geometric plane.

17. The electrical system of claim 9, wherein the electrical device comprises a vertical-cavity surface emitting laser (VCSEL).

18. The electrical system of claim 9, wherein the ground paths are electrically coupled by a wire bonds which are configured to arranged proximate to the electrical device.

19. The electrical system of claim 9, further comprising a second signal path electrically coupled to a second signal pad of an electrical substrate, wherein the electrical device is electrically coupled to the second signal path.

20. The electrical system of claim 19, wherein the second signal path and the second signal pad are differentially coupled to the signal path and signal pad.

21. The electrical system of claim 20, further including a ground path disposed between the differentially coupled signal path and second signal path.

22. A method of mounting an out-of-plane package structure on an electrical substrate to control impedance, comprising:
   arranging ground paths to control impedance, wherein the ground paths are arranged proximate to an electrical device and symmetric with respect to at least one geometric plane intersecting the electrical device;
   electrically coupling the electrical device to a signal path and to at least one of the ground paths;
   electrically coupling the signal path to a signal pad of an electrical substrate;
   electrically coupling ground paths to at least one ground plane of the electrical substrate; and
   connecting the ground paths with a ground arch to control impedance, the ground arch is arranged proximate to the electrical device and symmetric with respect to the at least one geometric plane.

23. The method of claim 22, wherein the electrical device is disposed between the ground paths.

24. The method of claim 22, further comprising forming a first portion of the ground paths at a ninety-degree angle to a second portion of the ground paths.

25. The method of claim 24, wherein the electrically coupling the ground paths comprises arranging the first portion of the ground paths parallel to the electrical substrate and arranging the second portion of the ground paths orthogonal to the electrical substrate.

26. An electrical system, including a controlled-impedance out-of-plane package structure mounted on an electrical substrate, comprising:
   a first signal path electrically coupled to a first signal pad of an electrical substrate;
   first ground paths electrically coupled to at least one ground plane of the electrical substrate;
   a first electrical device electrically coupled to the first signal path and to at least one of the first ground paths;
   a second signal path electrically coupled to a second signal pad of the electrical substrate;
   second ground paths electrically coupled to at least one ground plane of the electrical substrate;
   a connection electrically coupling at least one of the first ground paths and at least one of the second ground paths, wherein the connection is an inter-ground-arch linker; and
   a second electrical device electrically coupled to the second signal path and to at least one of the second ground paths,
   wherein the first ground paths are arranged proximate to the first electrical device and arranged symmetric with respect to at least one first geometric plane intersecting the first electrical device to control impedance, and the second ground paths are arranged proximate to the second electrical device and arranged symmetric with respect to at least one second geometric plane intersecting the second electrical device to control impedance.

27. The electrical system of claim 26, wherein the connection further comprises a wire bond.

* * * * *